(12) United States Patent
Mohan et al.

(10) Patent No.: US 10,804,588 B2
(45) Date of Patent: Oct. 13, 2020

(54) ANTENNA STRUCTURES FOR SPATIAL POWER-COMBINING DEVICES

(71) Applicant: Qorvo US, Inc., Greensboro, NC (US)

(72) Inventors: Ankush Mohan, Thousand Oaks, CA (US); Dan Denninghoff, Thousand Oaks, CA (US); Soack Yoon, Torrance, CA (US)

(73) Assignee: Qorvo US, Inc., Greensboro, NC (US)

( * ) Notice: Subject to any disclaimer, the term of this patent is extended or adjusted under 35 U.S.C. 154(b) by 7 days.

(21) Appl. No.: 16/214,234

(22) Filed: Dec. 10, 2018

(65) Prior Publication Data

US 2020/0185803 A1 Jun. 11, 2020

(51) Int. Cl.
*H01P 5/08* (2006.01)
*H01P 3/08* (2006.01)
*H03F 3/213* (2006.01)

(52) U.S. Cl.
CPC ............ *H01P 5/08* (2013.01); *H01P 3/081* (2013.01); *H03F 3/213* (2013.01); *H03F 2200/451* (2013.01)

(58) Field of Classification Search
CPC ............ H01P 5/08; H01P 3/081; H03F 3/213
USPC ......................................................... 333/136
See application file for complete search history.

(56) References Cited

U.S. PATENT DOCUMENTS

| | | |
|---|---|---|
| 3,023,382 A | 2/1962 | Borghetti |
| 4,234,854 A | 11/1980 | Schellenberg et al. |
| 4,424,496 A | 1/1984 | Nichols et al. |
| 5,036,335 A | 7/1991 | Jairam |
| 5,162,803 A * | 11/1992 | Chen .................. H01Q 3/22 342/372 |
| 5,214,394 A | 5/1993 | Wong |
| 5,256,988 A | 10/1993 | Izadian |
| 5,736,908 A | 4/1998 | Alexanian et al. |

(Continued)

FOREIGN PATENT DOCUMENTS

WO 2017214357 A2 12/2017

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Antenna structures for spatial power-combining devices are disclosed. A spatial power-combining device includes a plurality of amplifier assemblies, and each amplifier assembly includes an amplifier coupled between an input antenna and an output antenna. At least one of the input antenna or the output antenna comprises a nonlinear shape that is configured to propagate a signal along a nonlinear path to or from the amplifier with reduced signal loss. Accordingly, each amplifier may be configured on a corresponding amplifier assembly in a position such that each amplifier is spaced farther apart from other amplifiers in the spatial power-combining device. In this manner, heat generated by the amplifiers may be more evenly dissipated by the spatial power-combining device.

21 Claims, 10 Drawing Sheets

(56) References Cited

U.S. PATENT DOCUMENTS

| | | | |
|---|---|---|---|
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,293,801 | B2 | 3/2016 | Courtney et al. |
| 9,325,074 | B2 | 4/2016 | Chandler |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2014/0145794 | A1 | 5/2014 | Courtney et al. |
| 2014/0145795 | A1 | 5/2014 | Behan et al. |
| 2014/0167880 | A1 | 6/2014 | Daughenbaugh, Jr. et al. |
| 2015/0270817 | A1 | 9/2015 | Campbell |
| 2017/0149113 | A1 | 5/2017 | Theveneau et al. |
| 2017/0179598 | A1 | 6/2017 | Kitt |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |

OTHER PUBLICATIONS

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.
Leggieri, Alberto et al., "The Squarax Spatial Power Combiner," Progress in Electromagnetics Research C, vol. 45, Oct. 2013, EMW Publishing, pp. 43-55.
Ortiz, Sean C., "High Power Spatial Combiners: Tile and Tray Approaches," Dissertation, North Carolina State University, Electrical Engineering, Nov. 2001, 194 pages.
Notice of Allowance for U.S. Appl. No. 15/290,749, dated Feb. 16, 2018, 9 pages.
Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.
Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.
Fathy, A., et al., "A Simplified Approach for Radial Power Combiners," IEEE Transactions on Microwave Theory and Techniques, vol. 54, No. 1, Jan. 2006, pp. 247-255.
Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.
Tribak, A., et al., "Ultra-Broadband High Efficiency Mode Converter," Progress in Electromagnetics Research C, vol. 36, 2013, pp. 145-158.
Montgomery, R., et al., "Solid-State PAs Battle TWTAs for ECM Systems," Microwave Journal, Jun. 2017 Supplement, Jun. 14, 2017, 3 pages.
Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Author Unknown, "Interpack 2005: An assessment for PMMI members," 2005, PMMI, 32 pages.
Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.
Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.
Larkins, Grover, et al., "Evidence of Superconductivity in Doped Graphite and Graphene," Superconductor Science and Technology, vol. 29, Issue 1, Dec. 2015, IOP Publishing Ltd, 18 pages.
Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.

(56) References Cited

OTHER PUBLICATIONS

Notice of Allowance for U.S. Appl. No. 15/981,516, dated Jan. 15, 2020, 7 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Non-Final Office Action for U.S. Appl. No. 15/933,821, dated Jul. 11, 2019, 7 pages.
Non-Final Office Action for U.S. Appl. No. 15/981,516, dated Jul. 17, 2019, 5 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/032,252, dated Jun. 1, 2020, 7 pages.
Notice of Allowance for U.S. Appl. No. 16/039,435, dated Jun. 17, 2020, 8 pages.
Non-Final Office Action for U.S. Appl. No. 16/288,735, dated May 26, 2020, 9 pages.
Final Office Action for U.S. Appl. No. 16/191,541, dated Mar. 31, 2020, 8 pages.
Advisory Action, Examiner-Initiated Interview Summary, and AFCP 2.0 Decision for U.S. Appl. No. 16/191,541, dated May 21, 2020, 5 pages.
Notice of Allowance for U.S. Appl. No. 16/191,541, dated Jul. 9, 2020, 7 pages.

\* cited by examiner

ANTENNA STRUCTURES FOR SPATIAL
POWER-COMBINING DEVICES

FIELD OF THE DISCLOSURE

The disclosure relates generally to spatial power-combining devices and, more particularly, to antenna structures for spatial power-combining devices.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. Additional size and structural considerations for spatial power-combining devices involve providing good thermal management for heat generated during amplification.

The art continues to seek improved spatial power-combining devices having improved mechanical properties and good operating performance while being capable of overcoming challenges associated with conventional devices.

SUMMARY

Aspects disclosed herein relate to antenna structures for spatial power-combining devices. A spatial power-combining device includes a plurality of amplifier assemblies, and each amplifier assembly includes an amplifier coupled between an input antenna and an output antenna. At least one of the input antenna or the output antenna comprises a nonlinear shape that is configured to propagate a signal along a nonlinear path to or from the amplifier with reduced signal loss. Accordingly, each amplifier may be configured on a corresponding amplifier assembly in a position such that each amplifier is spaced farther apart from other amplifiers in the spatial power-combining device. In this manner, heat generated by the amplifiers may be more evenly dissipated by the spatial power-combining device.

In one aspect, a spatial power-combining device comprises a plurality of amplifier assemblies, wherein each amplifier assembly of the plurality of amplifier assemblies comprises: an amplifier; an input antenna structure comprising an input antenna; and an output antenna structure comprising an output antenna, wherein the amplifier is coupled between the input antenna structure and the output antenna structure and at least one of the input antenna or the output antenna comprises a nonlinear shape that is configured to propagate a signal along a nonlinear path to or from the amplifier. The input antenna may comprise an input signal conductor and an input ground conductor that collectively form the nonlinear shape. The spatial power-combining device may further comprise an input signal connector portion that is configured to couple the input signal conductor with the amplifier. The output antenna may comprise an output signal conductor and an output ground conductor that collectively form the nonlinear shape. The spatial power-combining device may further comprise an output signal connector portion that is configured to couple the output signal conductor with the amplifier. In certain embodiments, the input antenna is configured to receive the signal from a first position that is closer to an inner surface of the amplifier assembly than to an arcuate outer surface of the amplifier assembly. The amplifier may be configured at a second position that is closer to the arcuate outer surface than the first position is to the arcuate outer surface. In certain embodiments, the output antenna is configured to receive an amplified signal from the amplifier and propagate the amplified signal to a third position that is closer to the inner surface than second position is to the inner surface. In certain embodiments, each amplifier assembly comprises a body structure that comprises a nonlinear recess that corresponds to the nonlinear shape. At least a portion of the nonlinear recess may extend completely through the body structure. In certain embodiments, the body structure comprises a wedge shape. In certain embodiments, the nonlinear shape comprises a curved shape. The curved shape may comprise one or more inflection points.

The spatial power-combining device may further comprise an input coaxial waveguide section configured to concurrently provide a signal to the input antenna structure of each amplifier assembly of the plurality of amplifier assemblies; and an output coaxial waveguide section configured to concurrently combine a signal from the output antenna structure of each amplifier assembly of the plurality of amplifier assemblies. In certain embodiments, the plurality of amplifier assemblies is arranged radially around a center axis of the spatial power-combining device. The amplifier may comprise a monolithic microwave integrated circuit (MMIC) amplifier.

In another aspect, a solid state power amplifier (SSPA) comprises: a plurality of solid state amplifiers; a plurality of waveguide segments coupled to the plurality of solid state amplifiers; and a plurality of input antenna structures that are configured to transition portions of a signal propagating through certain ones of the plurality of waveguide segments to the plurality of solid state amplifiers, wherein at least one of the plurality of input antenna structures comprises a first nonlinear shape that is configured to propagate the signal along a nonlinear path. The input antenna structure may comprise an input signal conductor and an input ground conductor that collectively form an input antenna comprising the first nonlinear shape. The SSPA may further comprise a plurality of output antenna structures that are configured to transition amplified signals from the plurality of solid state amplifiers to different ones of the plurality of waveguide segments, wherein in at least one of the plurality of output antenna structures comprises a second nonlinear shape that is configured to propagate the corresponding amplified signal along a second nonlinear path. The output antenna structure may comprise an output signal conductor and an output ground conductor that collectively form an output antenna comprising the second nonlinear shape. In certain embodiments, the plurality of solid state amplifiers comprises a plurality of monolithic microwave integrated circuit (MMIC) amplifiers.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
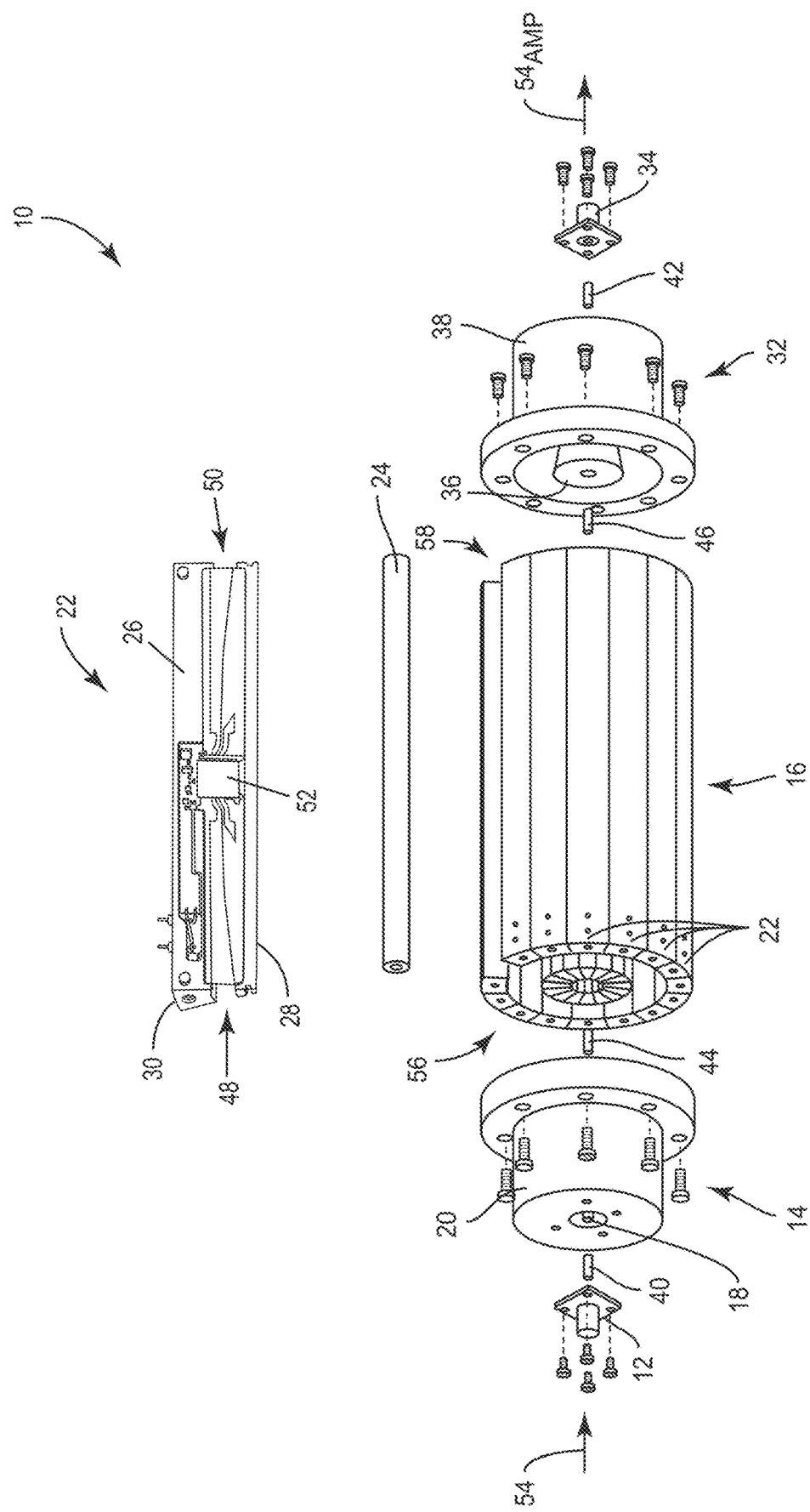
FIG. 1 is a partially-exploded perspective view of a spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to antenna structures for spatial power-combining devices. A spatial power-combining device includes a plurality of amplifier assemblies, and each amplifier assembly includes an amplifier coupled between an input antenna and an output antenna. At least one of the input antenna or the output antenna comprises a nonlinear shape that is configured to propagate a signal along a nonlinear path to or from the amplifier with reduced signal loss. Accordingly, each amplifier may be configured on a corresponding amplifier assembly in a position such that each amplifier is spaced farther apart from other amplifiers in the spatial power-combining device. In this manner, heat generated by the amplifiers may be more evenly dissipated by the spatial power-combining device.

The embodiments disclosed herein are particularly adapted to spatial power-combining devices that operate at microwave frequencies such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of about 2 GHz to 20 GHz, or about 4 GHz to 40 GHz.

A spatial power-combining device generally includes a plurality of amplifier assemblies, and each amplifier assembly is an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are typically arranged coaxially about a center axis. Accordingly, the spatial power-combining device is configured to split, amplify, and combine an electromagnetic signal.

FIG. 1 is a partially-exploded perspective view of a spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 includes an inner conductor 18 and an outer conductor 20 that radially surrounds the inner conductor 18, thereby forming an opening therebetween. Outer surfaces of the inner conductor 18 and an inner surface of the outer conductor 20 have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1, the center post 24 is illustrated in an exploded manner. Each amplifier assembly 22 comprises a body structure 26 having a predetermined wedge-shaped cross-section, an arcuate inner surface or edge 28, and an arcuate outer surface or edge 30. When the amplifier assemblies 22 are assembled radially about the center axis, they collectively form the center waveguide section 16 with a generally cylindrical shape; however, other shapes are possible, such as rectangular, oval, or other geometric shapes. The inner surface 28 and the outer surface 30 refer to how surfaces of each amplifier assembly 22 are configured when the plurality of amplifier assemblies 22 are radially arranged around the center post 24, or a center axis for embodiments where the center post 24 is omitted. For example, when assembled, the inner surface 28 of each amplifier assembly 22 is radially arranged around the center post 24 or axis that is internal to the center waveguide section 16, and the outer surface 30 of each amplifier assembly 22 collectively forms a cylindrical outer surface of the center waveguide section 16.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections and may have a cylindrical shape, a non-cylindrical shape, or may be omitted altogether.

Each amplifier assembly 22 comprises an input antenna structure 48 and an output antenna structure 50, both of which are coupled to an amplifier 52. In some embodiments, the amplifier 52 comprises a monolithic microwave integrated circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The output antenna structures 50 collectively form an output antenna array 58 that operates to provide the amplified signal portions to be concurrently combined inside the opening of the output coaxial waveguide section 32 to form an amplified output signal $54_{AMP}$, which is then propagated through the output coaxial waveguide section 32 to the output port 34. As illustrated in FIG. 1, the input antenna structure 48 is configured with a linear shape or pattern between the input coaxial waveguide section 14 and the amplifier 52, and the output antenna structure 50 is also configured with a linear shape or pattern that is between the output coaxial waveguide section 32 and the amplifier 52. In this manner, the amplifier 52 is centrally located in each amplifier assembly 22.

Figure 2A:
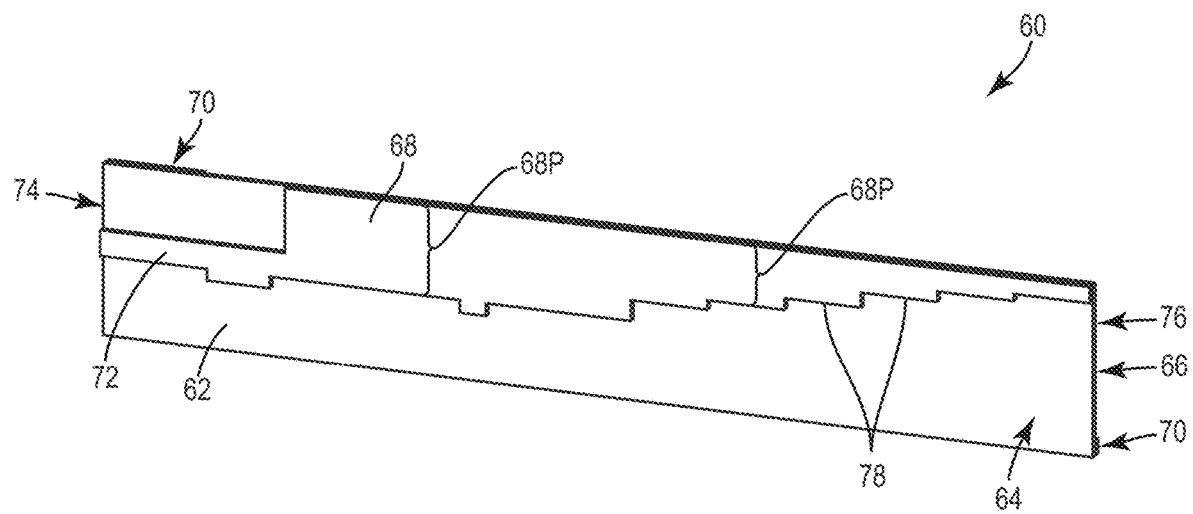
FIG. 2A is a perspective view of a representative antenna structure of a spatial power-combining device.

FIG. 2A is a perspective view of a representative antenna structure 60 of a spatial power-combining device. The antenna structure 60 may represent an input antenna structure or an output antenna structure as previously described. The antenna structure 60 includes a board 62, or substrate, that has a first face 64 and a second face 66 that opposes the first face 64. The first face 64 supports a signal conductor 68 and the second face 66 supports a ground conductor 70 that is barely visible in the perspective view of FIG. 2A. The board 62 may be a printed circuit board and provides a desired form factor and mechanical support for the signal conductor 68 and the ground conductor 70. The signal conductor 68 includes a signal connector portion 72 adjacent a first edge 74 of the antenna structure 60 that is configured to be coupled to an amplifier in a spatial power-combining device. In operation, the antenna structure 60 may be configured as an input antenna structure or an output antenna structure to deliver or transmit a portion of an electromagnetic signal to or from an amplifier via the signal connector portion 72. The signal conductor 68 includes a first profile 68P that tapers from the first edge 74 toward a second edge 76 that opposes the first edge 74. For reference, FIG. 2A includes two brackets for the first profile 68P to indicate the tapering from left to right in the figure. In some embodiments, the first profile 68P may continuously taper from the first edge 74 to the second edge 76. In other embodiments and as illustrated in FIG. 2A, the signal conductor 68 may include first tuning features 78 configured to provide a desired operating frequency and an operating bandwidth.

Each of the first tuning features 78 is configured for a different portion of the operating bandwidth. In some embodiments, the first tuning features 78 form the first profile 68P that is stepped. In this manner, the first tuning features 78 include a series of steps in a first direction from the first edge 74 to the second edge 76. The series of steps may be symmetric or non-symmetric with each other. Non-symmetric steps may include steps having different shapes, lengths, and/or heights.

Figure 2B:
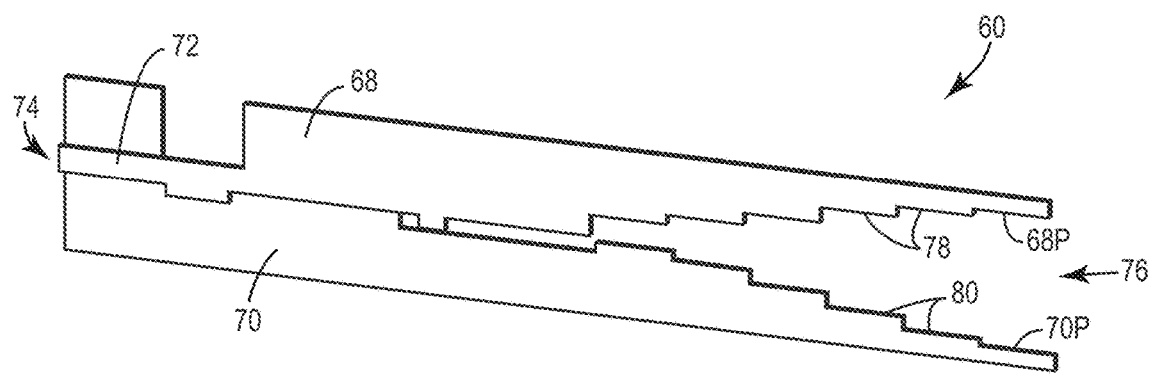
FIG. 2B is a perspective view of the representative antenna structure of FIG. 2A with a board removed in order to view a ground conductor.

FIG. 2B is a perspective view of the representative antenna structure 60 of FIG. 2A with the board 62 removed in order to view the ground conductor 70. The ground conductor 70 includes a second profile 70P that tapers from the first edge 74 toward the second edge 76. The first profile 68P and the second profile 70P diverge away from each other along parallel planes in a lengthwise direction along the antenna structure 60. In a similar manner to the first tuning features 78 of the signal conductor 68, the ground conductor 70 may include second tuning features 80 configured to provide a desired operating frequency and an operating bandwidth. In some embodiments, the second tuning features 80 form the second profile 70P that is stepped. In this manner, the second tuning features 80 include a series of steps in the direction from the first edge 74 to the second edge 76. The series of steps may be symmetric or non-symmetric with each other. As previously described, non-symmetric steps may include steps having different shapes, different heights, and/or different lengths. In certain embodiments where the first profile 68P continuously tapers from the first edge 74 to the second edge 76, the second profile 70P may also continuously taper from the first edge 74 to the second edge 76 without stepped tuning features.

As previously described, the antenna structure 60 may be configured as in input antenna structure that is configured to receive an electromagnetic signal or an output antenna structure that is configured to transmit an amplified electromagnetic signal from an amplifier. In operation, when the antenna structure 60 is configured as an output antenna structure, the signal connector portion 72 is configured to receive the amplified signal. The overlapping portion between the signal connector portion 72 and the ground conductor 70 functions as a microstrip signal launch or microstrip line where energy propagates in a direction that is a shortest distance between the signal connector portion 72 and the ground conductor 70. At the first edge 74, the shortest distance between the signal connector portion 72 and the ground conductor 70 is directly through the board 62 (FIG. 2A) from the first face 64 (FIG. 2A) to the second face 66 (FIG. 2A), or about perpendicular to the planes of the signal conductor 68 and the ground conductor 70. For embodiments without a board 62, the shortest distance is the same, except the signal connector portion 72 and the ground conductor 70 may be separated by air. As energy propagates across the antenna structure 60 toward the second edge 76, the signal conductor 68 and the ground conductor 70 taper away from each other. In this manner, the shortest distance between the signal conductor 68 and the ground conductor 70 is progressively farther apart toward the second edge 76. Accordingly, energy propagating between the signal conductor 68 and the ground conductor 70 near the second edge 76 comprises a direction that is rotated about 90° from the propagation direction near the first edge 74, or about parallel to the planes of the signal conductor 68 and the ground conductor 70. The area of the antenna structure 60 that includes the signal connector portion 72 is the microstrip line for coupling with an amplifier, and the areas of the antenna structure 60 where the signal conductor 68 and the ground conductor 70 diverge away from each other are the antenna of the antenna structure 60. As shown, the antenna structure 60 is configured in a linear shape from the first edge 74 to the second edge 76 and, accordingly, a signal propagating through the antenna structure 60 will travel along a generally linear path from the first edge 74 to the second edge 76. When the antenna structure 60 is configured as an input antenna structure, the operation is similar, but with a signal propagating from the second edge 76 to the first edge 74. A combination of the overall dimensions of the antenna structure 60, as well as the shape of the first profile 68P and the second profile 70P, determines the operating performance and bandwidth.

Figure 3:
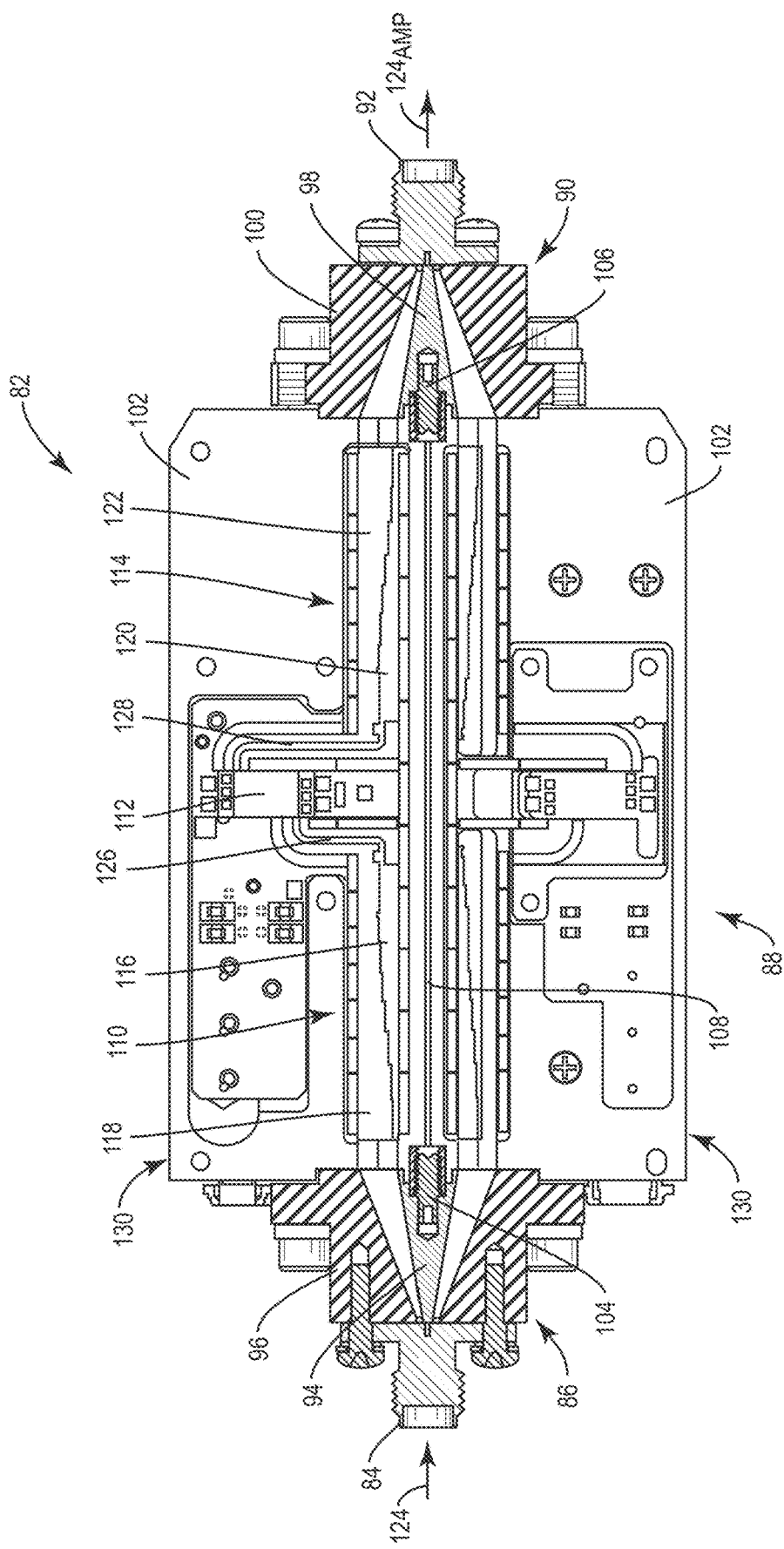
FIG. 3 is a partial cross-sectional view of a spatial power-combining device with an alternative configuration to the spatial power-combining device of FIG. 1.

FIG. 3 is a partial cross-sectional view of a spatial power-combining device 82 with an alternative configuration to the spatial power-combining device 10 of FIG. 1. In FIG. 3, the center post (24 of FIG. 1) has been omitted. The spatial power-combining device 82 includes an input port 84, an input coaxial waveguide section 86, a center waveguide section 88, an output coaxial waveguide section 90, and an output port 92 as previously described. The input coaxial waveguide section 86 comprises an input inner conductor 94 and an input outer conductor 96, and the output coaxial waveguide section 90 comprises an output inner conductor 98 and an output outer conductor 100. The center waveguide section 88 comprises a plurality of amplifier assemblies 102 as previously described. As shown, the input inner conductor 94 is configured to mechanically attach to the amplifier assemblies 102 by a first screw 104, and the output inner conductor 98 is configured to mechanically attach to amplifier assemblies 102 by a second screw 106. The mechanical attachment allows a center axis 108 of the spatial power-combining device 82 to be hollow. Accordingly, the spacing of the amplifier assemblies can be reduced to achieve higher frequency operation and increased bandwidth. In some applications, the operating frequency range includes an operating bandwidth spread of about 4 GHz to 41 GHz. For such applications, the reduced spacing may only allow for a reduced number of amplifier assemblies. In some embodiments, the plurality of amplifier assemblies comprise fewer than ten amplifier assemblies. For the operating bandwidth spread of 4 GHz to 41 GHz, some embodiments may comprise eight amplifier assemblies and may therefore be referred to as an eight-way spatial power-combining device. In other embodiments with a lower operating bandwidth spread, such as 2 GHz to 20 GHz, the spacing may be greater and more amplifier assemblies may be included.

As shown in FIG. 3, each amplifier assembly 102 comprises an input antenna structure 110, an amplifier 112, and an output antenna structure 114. The input antenna structure 110 comprises an input signal conductor 116 that is visible in FIG. 3, supported on a first board 118. The output antenna structure 114 comprises an output signal conductor 120 that is also visible in FIG. 3, supported on a second board 122. It is understood that the input antenna structure 110 may additionally include an input ground conductor on an opposite side of the first board 118, and the output antenna structure 114 may additionally comprise an output ground conductor on an opposite side of the second board 122. The input antenna structure 110 and the output antenna structure 114 are arranged in a linear manner between the input coaxial waveguide section 86 and the output coaxial waveguide section 90. In operation, a signal 124 enters through the input port 84 and propagates through the input coaxial waveguide section 86 to the input antenna structure 110 of each amplifier assembly 102. Each input antenna structure 110 couples the signal 124 to each amplifier 112 via an input signal connector portion 126, and an output signal connector portion 128 couples an amplified signal 124$_{AMP}$ to each output antenna structure 114, where the amplified signal 124$_{AMP}$ is then coupled to the output coaxial waveguide section 90 to be propagated to the output port 92. As previously described, the input signal connector portion 126 and the output signal connector portion 128 are microstrip lines for coupling the amplifier 112 with the respective antennas of the input antenna structure 110 and the output antenna structure 114. The amplifier 112 in each of the amplifier assemblies 102 is typically configured for high power amplification, and may therefore generate a high amount of heat during operation. If the operating temperature of each amplifier 112 increases too much, the performance and lifetime of each amplifier 112 may suffer. As previously described, the plurality of amplifier assemblies 102 form the center waveguide section 88. In this regard, thermal management is needed to effectively dissipate heat in and around the center waveguide section 88. Accordingly, each amplifier assembly 102 may typically comprise a thermally conductive material, such as copper (Cu), aluminum (Al), or alloys thereof that are configured to dissipate enough heat from the amplifier 112 to maintain a suitably low operating temperature. In other embodiments, each amplifier assembly 102 may comprise an allotrope of carbon, such as graphite that is configured to dissipate heat from the amplifier 112. Additionally, a heat transfer device or heat sink may be arranged to at least partially surround the center waveguide section 88 adjacent to an outer surface 130 of each amplifier assembly 102 to further spread and dissipate heat from the amplifier assemblies 102.

As illustrated, the amplifier 112 of each amplifier assembly 102 is centrally located between the input coaxial waveguide section 86 and the output coaxial waveguide section 90. In this regard, the plurality of amplifiers 112 are centrally aligned within the center waveguide section 88, and the position of each amplifier 112 on a corresponding amplifier assembly 102 may influence how heat is concentrated within the center waveguide section 88 during operation. For example, if each amplifier 112 is positioned on a corresponding amplifier assembly 102 closer to the center axis 108, then the amplifiers 112 will be closer to each other within the center waveguide section 88 and may therefore experience higher heat during operation. Positioning each amplifier 112 closer to the outer surface 130 of each amplifier assembly 102 will accordingly configure the amplifiers 112 to be farther apart from each other. Additionally, each amplifier 112 will also be arranged on a thicker portion of the wedge-shape of each amplifier assembly 102. In this manner, heat generated by the amplifiers 112 will be spaced farther apart within the center waveguide section 88 and will have less distance to travel in order to reach the outer surface 130 of each amplifier assembly 102. Spacing each amplifier 112 closer to the outer surface 130 does, however, create a longer distance for the signal 124 to travel from the input antenna structure 110 to the amplifier 112 as well as a longer distance for the amplified signal 124$_{Amp}$ to travel from the amplifier 112 to the output antenna structure 114. Accordingly, the input signal connector portion 126 and the output signal connector portion 128 are longer to route signals between the amplifier 112 and the respective antennas of the input antenna structure 110 and the output antenna structure 114. While it is desirable for thermal management to position each amplifier 112 closer to the outer surface 130 and on a thicker portion of the wedge-shape of each amplifier assembly 102, longer input and output signal connector portions 112, 114 can contribute to higher insertion losses of propagating signals. The insertion losses can 1 decibel (dB) or higher at 40 GHz depending on the application.

Figure 4A:
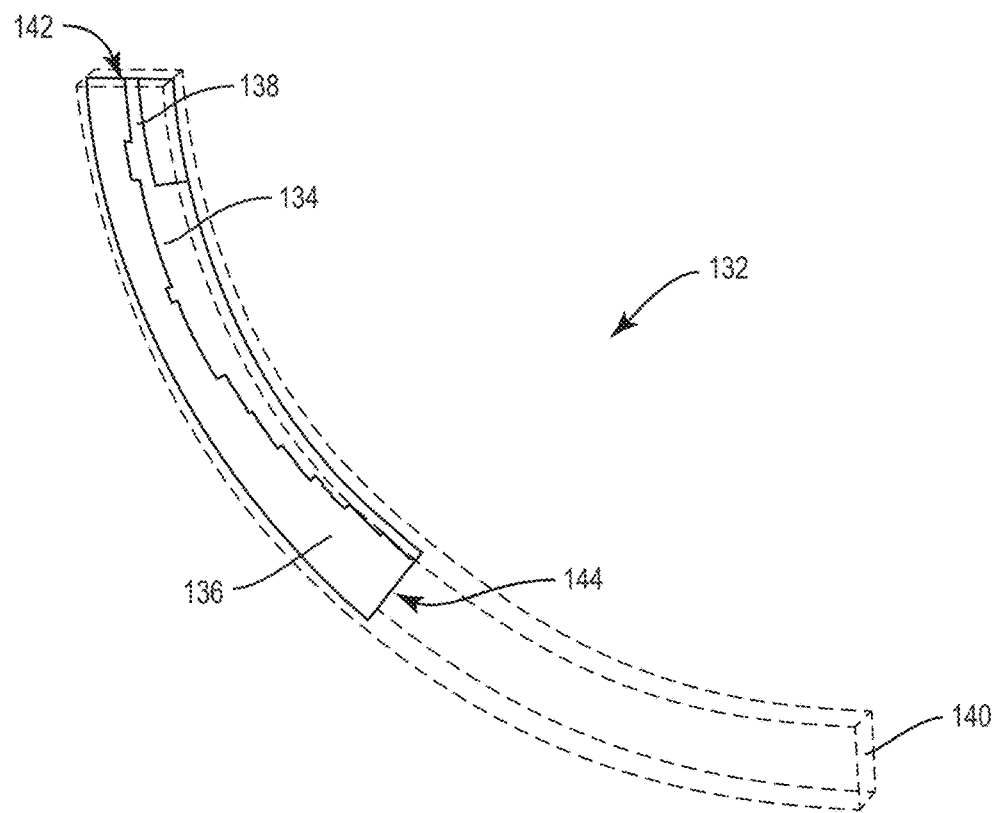
FIG. 4A represents an antenna structure that comprises a nonlinear shape according to embodiments disclosed herein.
Figure 4B:
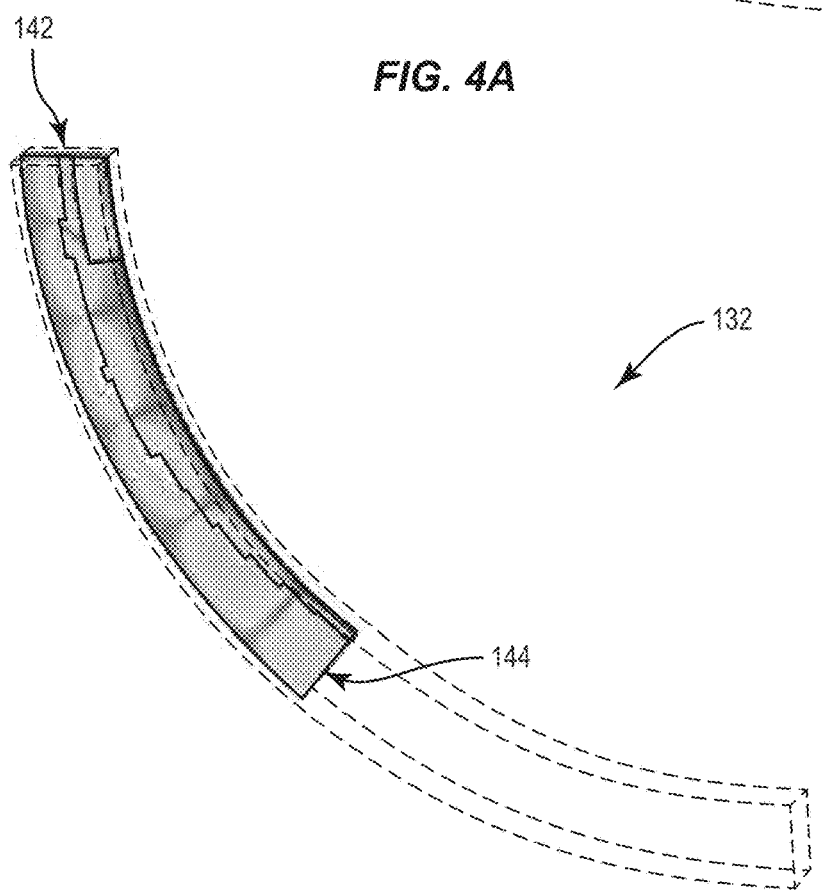
FIG. 4B represents electric field pattern simulations for the antenna structure of FIG. 4A.

FIG. 4A represents an antenna structure 132 that comprises a nonlinear shape according to embodiments disclosed herein. A nonlinear shape configures the antenna structure 132 to direct or guide a signal in a nonlinear manner. As previously described, the antenna structure 132 includes a signal conductor 134 and a ground conductor (not visible) on opposing faces of a board 136, as well as a signal connector portion 138 that is configured to be electrically connected to an amplifier (not shown). In FIG. 4A, the antenna structure 132 is shown within an air cavity 140 as indicated by the dashed lines. As illustrated, the antenna structure 132 comprises a gradual curve from a first edge 142 to a second edge 144. In particular, the signal conductor 134 and the ground conductor (not visible) form an antenna of the antenna structure 132 that comprise the gradual curve. In this manner, a signal propagating through the antenna structure 132 will be guided by the signal conductor 134 and the ground conductor (not visible) along the gradual curve from the first edge 142 to the second edge 144. In certain embodiments, one or more gradual curves allow the antenna structure 132 to effectively guide a signal along a nonlinear path with reduced signal losses. FIG. 4B represents electric field pattern simulations for the antenna structure 132 of FIG. 4A. As illustrated, the electric field pattern follows the curve of the antenna structure 132 such that a signal propagating between the first edge 142 and the second edge 144 is guided along the curve. While the antenna structure 132 is illustrated with a single continuous curved shape in FIGS. 4A and 4B, it is understood that the antenna structure 132 can comprise other non-linear shapes. For example, the antenna structure 132 can comprise different areas with different radiuses of curvatures, or a curved shape with one or more inflection points.

Figure 5:
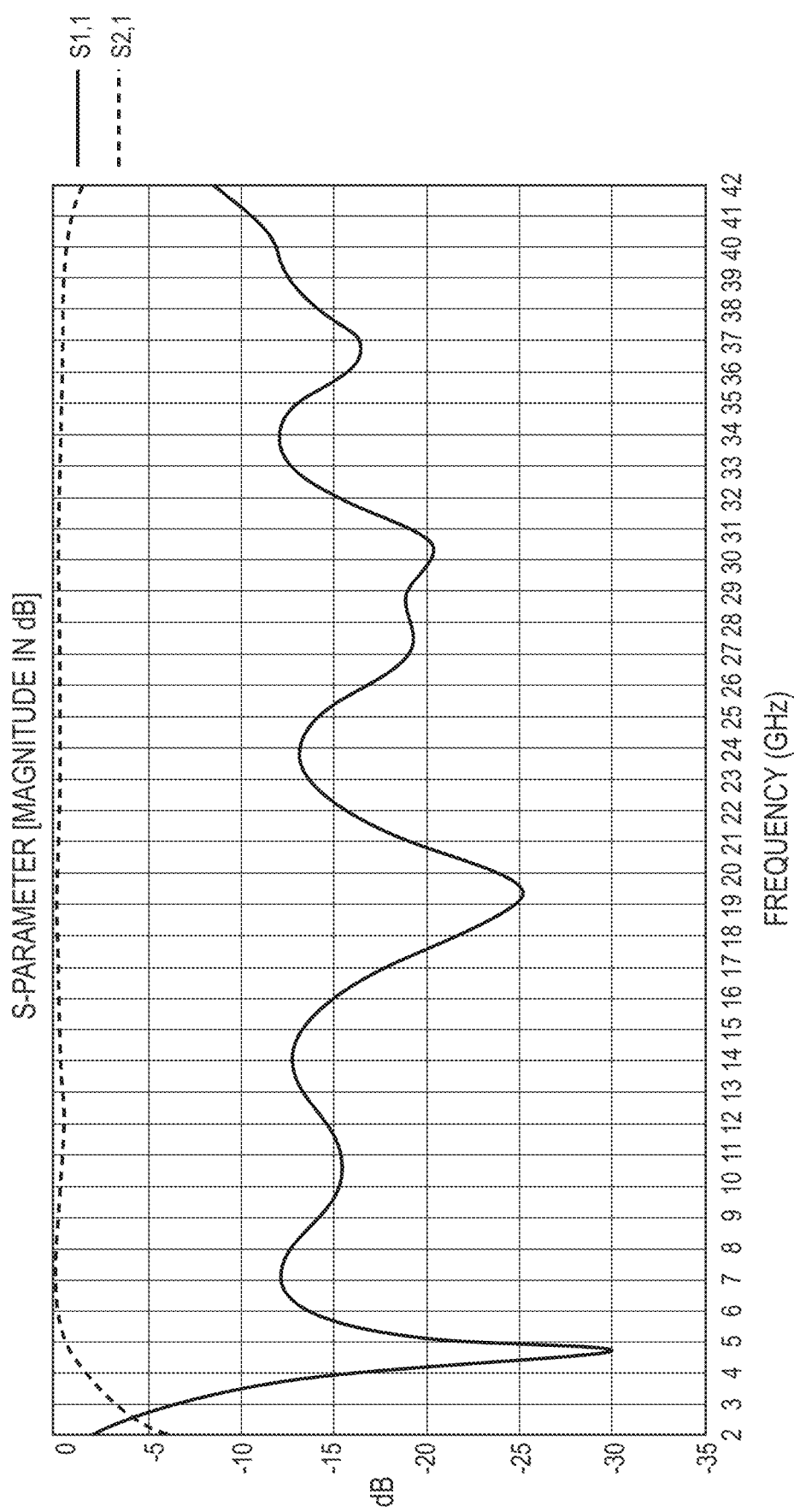
FIG. 5 is a scattering parameters (S-parameters) plot for the antenna structure illustrated in FIG. 4A.

FIG. 5 is a scattering parameters (S-parameters) plot for the antenna structure 132 illustrated in FIG. 4A. The S-parameter magnitude is plotted in dB across a GHz frequency range. The return loss, or S1,1, is an indication of how much power is reflected from the antenna structure 132. For frequencies where S1,1 is equal to 0 dB, then substantially all power from a signal is reflected. The insertion loss, or S2,1, is an indication of how much power is transferred by the antenna structure 132. For frequencies where S2,1 is equal to 0 dB, then substantially all power from a signal is transferred. Accordingly, the curved shape of the antenna structure 132 is able to demonstrate good power transfer across a wide bandwidth that includes a range of at least 4 GHz to 40 GHz.

Figure 6A:
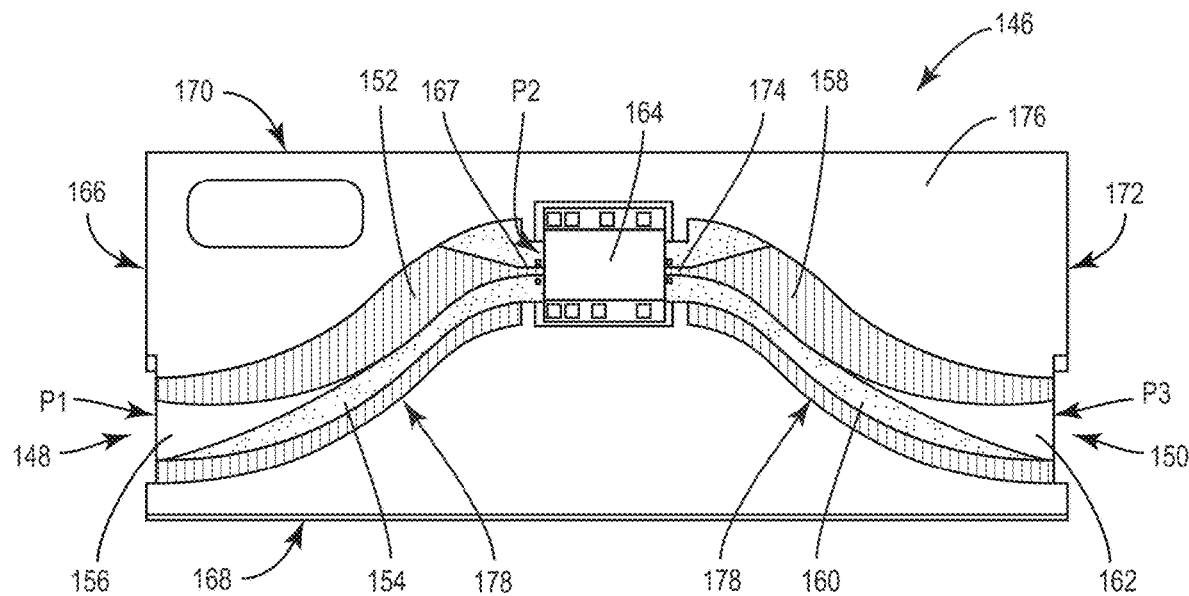
FIG. 6A is a front view of an amplifier assembly with an input antenna structure and an output antenna structure that are both nonlinear according to embodiments disclosed herein.

FIG. 6A is a front view of an amplifier assembly 146 with an input antenna structure 148 and an output antenna structure 150 that are both nonlinear according to embodiments disclosed herein. The input antenna structure 148 includes an input signal conductor 152 and an input ground conductor 154 on opposing faces of a first board 156, and the output antenna structure 150 includes an output signal conductor 158 and an output ground conductor 160 on opposing faces of a second board 162 as previously described. For illustrative purposes, the first board 156 and the second board 162 are shown as at least partially transparent so that the input ground conductor 154 and the output ground conductor 160 are both visible. An amplifier 164 is coupled between the input antenna structure 148 and the output antenna structure 150 as previously described. As shown, the input signal conductor 152 and the input ground conductor 154 diverge away from each other in a direction from the amplifier 164 toward a first edge 166 of the amplifier assembly 146. In this manner, the input signal conductor 152 and the output ground conductor 154 form an input antenna 152/154 that is configured to receive and propagate a signal to the amplifier 164. The signal is delivered to the amplifier 164 by way of an input signal connector portion 167. The input antenna 152/154 comprises a nonlinear shape and, in particular, the input signal conductor 152 and the input ground conductor 154 collectively form the nonlinear shape. In this manner, a signal may be received in a first position P1 that is closer to an inner surface 168 of the amplifier assembly 146 and subsequently propagated to the amplifier 164 that is configured in a second position P2 that is closer to an outer surface 170 of the amplifier assembly 146. The nonlinear shape of the input antenna 152/154 is thereby configured to propagate the signal along a corresponding nonlinear path to the amplifier 164 in a manner that a length of the input signal connector portion 166 is as small as possible. Accordingly, the amplifier 164 is positioned closer to the outer surface 170 of the amplifier assembly 146 for improved heat dissipation and signal losses associated with longer microstrip connectors are reduced. In a similar manner, the output signal conductor 158 and the output ground conductor 160 diverge away from each other in a direction from the amplifier 164 toward a second edge 172 of the amplifier assembly 146. The output signal conductor 158 and the output ground conductor 160 collectively form an output antenna 158/160. The output antenna 158/160 is configured to receive and propagate an amplified signal from the amplifier 164 to the second edge 172 at a third position P3 that is closer to the inner surface 168 than the second position P2 is to the inner surface 168. The output antenna 158/160 also comprises a nonlinear shape. In certain embodiments, the nonlinear shape of the output antenna 158/160 is a mirror image of the nonlinear shape of the input antenna 152/154 from the amplifier 164. In this manner, a length of an output signal connector portion 174 may also be reduced. The nonlinear shapes of the input antenna 152/154 and the output antenna 158/160 may comprise a curved shape with one or more inflection points that are configured to gradually guide signals to and from the amplifier 164.

Figure 6B:
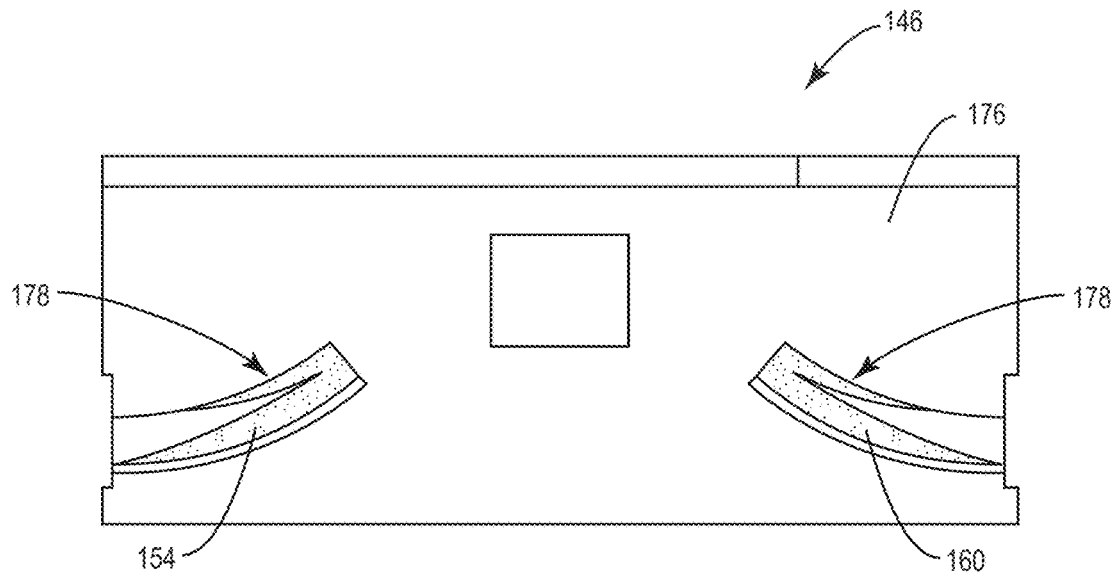
FIG. 6B is a backside view of the amplifier assembly of FIG. 6A.

As illustrated in FIG. 6A, a body structure 176 of the amplifier assembly 146 comprises one or more nonlinear recesses 178 that correspond to the nonlinear shape of the input antenna structure 148 and the output antenna structure 150. The nonlinear recesses 178 are areas of the body structure 176 where the input antenna structure 148 and the output antenna structure 150 are mounted in certain embodiments. In particular, the first board 156 and the second board 162 may comprise the nonlinear shape and may be at least partially mounted in the nonlinear recesses 178. Additionally, at least a portion of the nonlinear recesses 178 may extend completely through the body structure 176, such as in the areas where the input signal conductor 152 diverges away from the input ground conductor 154 and where the output signal conductor 158 diverges away from the input ground conductor 160. FIG. 6B is a backside view of the amplifier assembly 146 of FIG. 6A. From the backside view, a portion of the input ground conductor 154 and the output ground conductor 160 are visible through a portion of the nonlinear recesses 178 that extends completely through the body structure 176.

Figure 7:
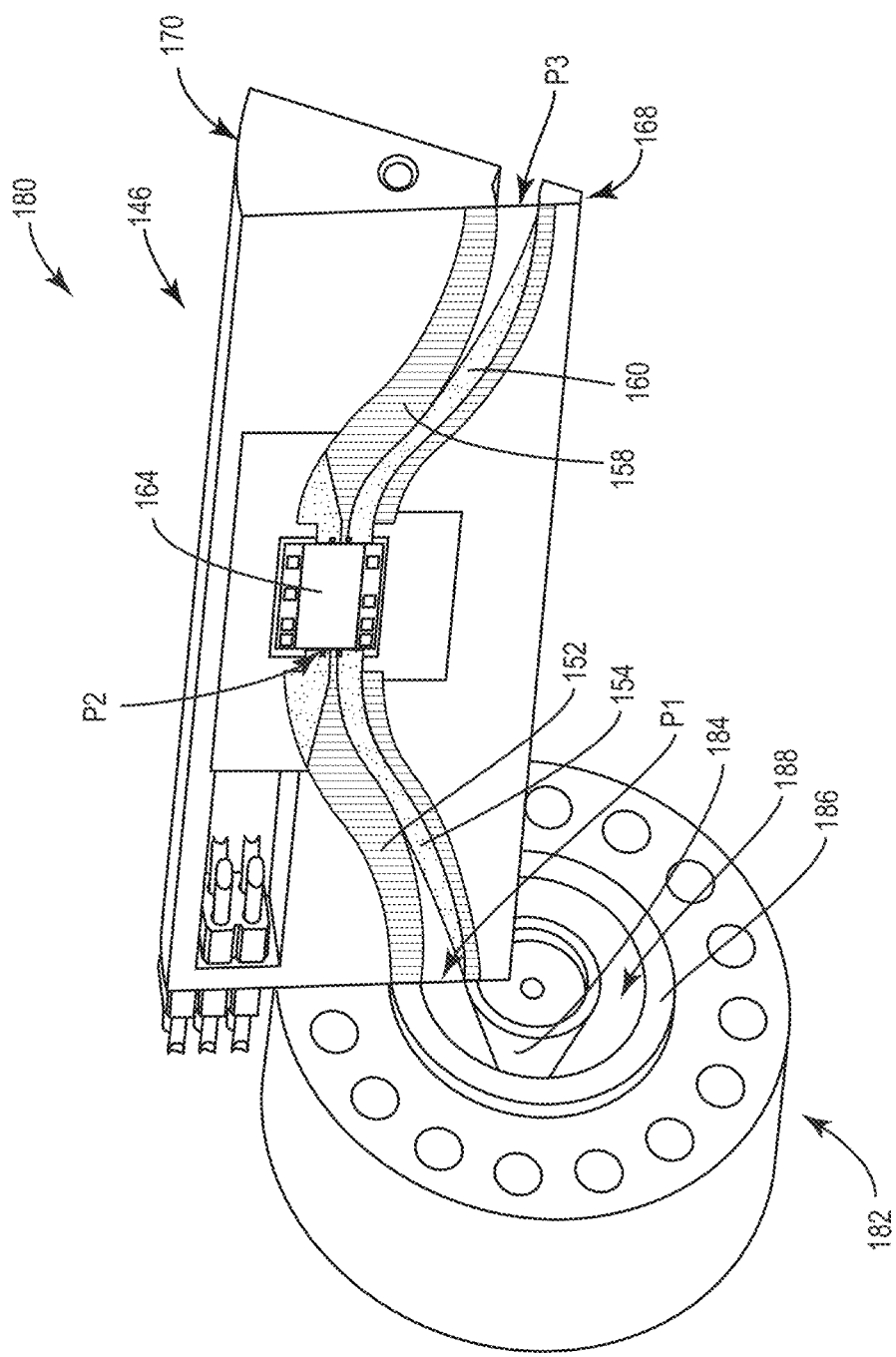
FIG. 7 is a perspective view of a partially assembled spatial power-combining device that includes the amplifier assembly of FIGS. 6A and 6B.

FIG. 7 is a perspective view of a partially assembled spatial power combining device 180 that includes the amplifier assembly 146 of FIGS. 6A and 6B. An input coaxial waveguide section 182 is illustrated to show how a signal may propagate to the amplifier assembly 146. For simplicity in the drawing, an input port, an output coaxial waveguide section, and an output port are not shown. Additionally, while only one amplifier assembly 146 is shown, it is understood that when the spatial power combining device 180 is fully assembled, a plurality of amplifier assemblies 146 may be radially arranged as illustrated in FIG. 1 such that the outer surface 170 of each amplifier assembly collectively forms an outer surface of the center waveguide section (16 of FIG. 1). In certain embodiments, one or both of the inner surface 168 and the outer surface 170 comprises an arcuate surface such that the plurality of amplifier assemblies 146 form a cylindrical shape when radially arranged. As previously described, the input coaxial waveguide section 182 includes an inner conductor 184 and an outer conductor 186 that radially surrounds the inner conductor 184, thereby forming an opening 188 therebetween. The area where the input signal conductor 152 and the input ground conductor 154 diverge away from each other is aligned with the opening 188. In this manner, a signal propagating within the opening 188 is received by the input antenna 152/154 formed by the input signal conductor 152 and the input ground conductor 154 and guided along a nonlinear path to the amplifier 164. In particular, the signal is received by the input antenna 152/154 at the first position P1 that is closer to the inner surface 168 than to the outer surface 170, and the input antenna 152/154 is configured to guide the signal to the amplifier 164 configured at the second position P2 that is closer to the outer surface 170 than to the inner surface 168. In a similar manner, the output antenna 158/160 formed by the output signal conductor 158 and the output ground conductor 160 is configured to receive an amplified signal from the amplifier 164 and guide the amplified signal to the third position P3 that is closer to the inner surface 168 than the second position P2 is. While not shown, an output coaxial waveguide section would be configured to receive the amplified signal at the third position P3 in a similar manner to how the input coaxial waveguide section 182 is configured relative to the second position P2. In certain embodiments, the second position P2 and the third position P3 are configured at equal distances from the inner surface 168.

As previously described, when a plurality of amplifier assemblies are radially arranged about a center axis, it may be desirable to position an amplifier of each amplifier assembly as close as possible to an outer surface of each amplifier assembly to improve heat dissipation within each amplifier assembly. FIGS. 8A, 8B, 9A, and 9B represent thermal image maps during operation comparing standard amplifier placement with amplifiers positioned closer to an outer surface or edge of an amplifier assembly according to embodiments as disclosed herein. For comparison purposes, the body structure 176 of the amplifier assembly 146 as described for FIGS. 6A and 6B was kept the same in the heat maps of FIGS. 8A, 8B, 9A, and 9B to accurately compare different amplifier placements.

Figure 8A:
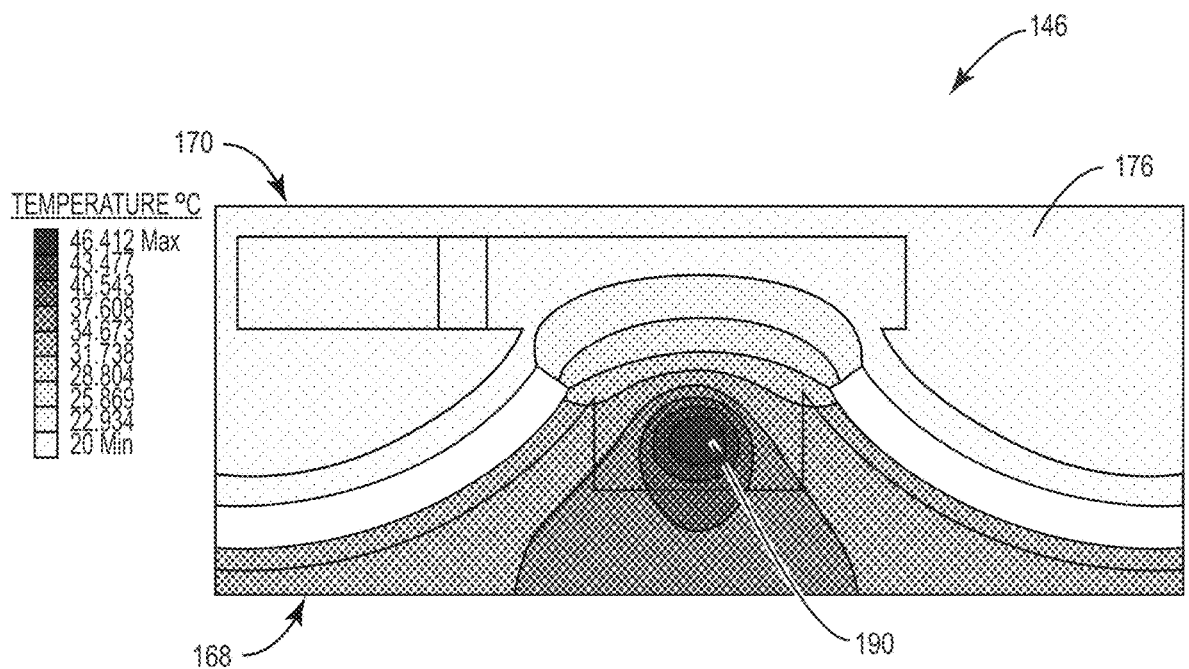
FIG. 8A illustrates a thermal map of the amplifier assembly of FIGS. 6A and 6B with a standard amplifier placement.
Figure 8B:
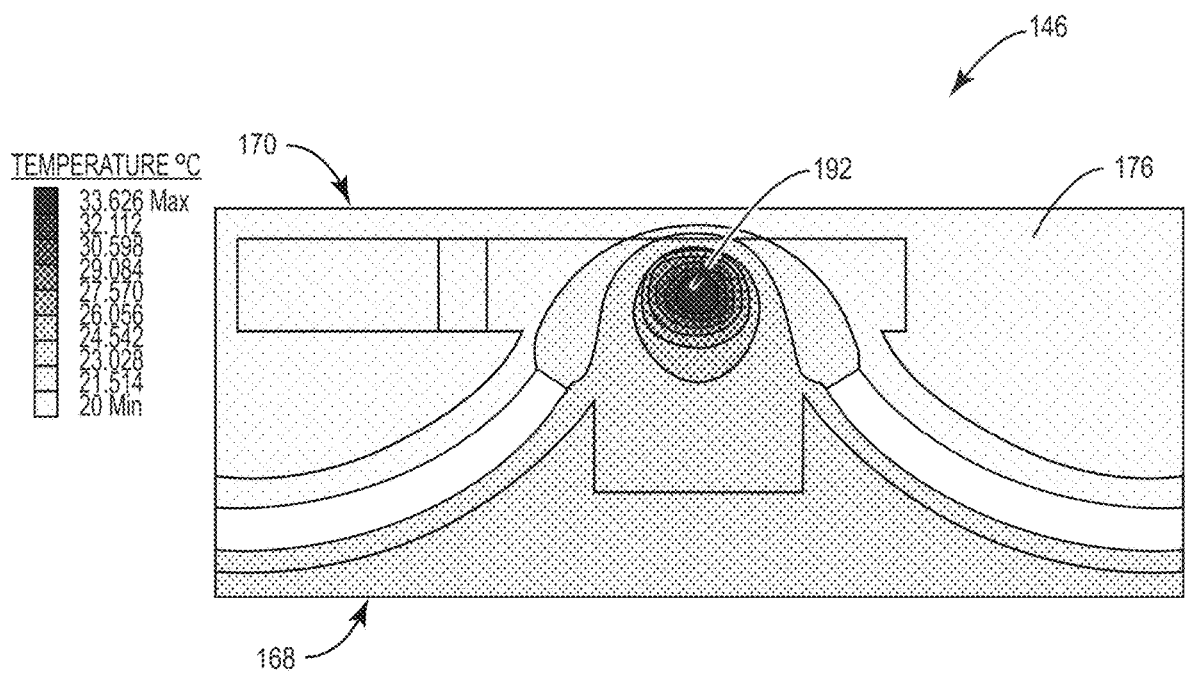
FIG. 8B illustrates a thermal map of the amplifier assembly of FIGS. 6A and 6B with an amplifier mounting location that is closer to an outer surface according to embodiments described herein.
Figure 9A:
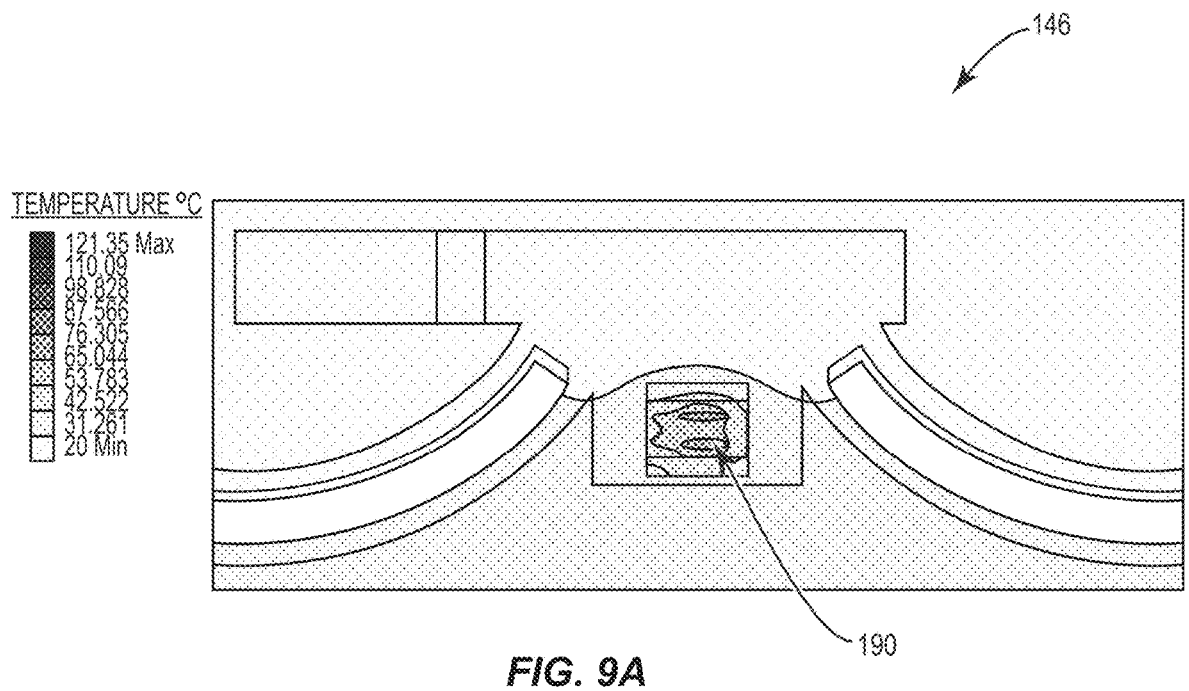
FIG. 9A illustrates the thermal map of FIG. 8A on a larger temperature scale.
Figure 9B:
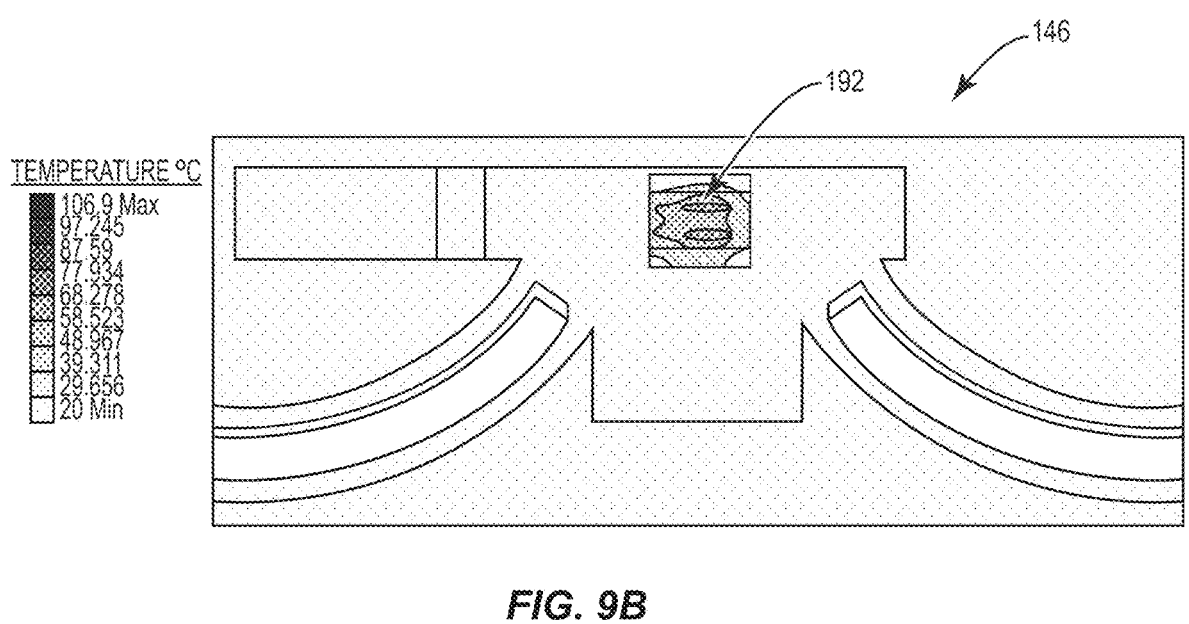
FIG. 9B illustrates the thermal map of FIG. 8B on a larger temperature scale.

FIG. 8A illustrates a thermal map of the amplifier assembly 146 of FIGS. 6A and 6B with a standard amplifier placement. As previously described, for standard linear antenna structures, an amplifier mounting location 190 is typically positioned central to the linear antenna structures and may be arranged closer to the inner surface 168 than to the outer surface 170 of the amplifier assembly 146. During operation, an amplifier that is mounted in the amplifier mounting location 190 generates heat and, accordingly, the amplifier mounting location 190 is the hottest area of the amplifier assembly 146. As illustrated, the hottest area is thereby closer to the inner surface 168. For wedge-shaped amplifier assemblies, the inner surface 168 also comprises thinner portions or less material of the body structure 176. In this manner, heat is concentrated and notably higher near the inner surface 168. FIG. 8B illustrates a thermal map of the amplifier assembly 146 of FIGS. 6A and 6B with an amplifier mounting location 192 that is closer to the outer surface 170 according to embodiments described herein. As previously described, nonlinear antenna structures allow the amplifier mounting location 192 to be configured closer to the outer surface 176 without increasing signal losses associated with longer signal connector portions. During operation, the hottest area is shown at the amplifier mounting location 192 that is closer to the outer surface 170. While the amplifier assembly 146 is still somewhat hotter near the inner surface 168, the heat concentration is more evenly distributed across the amplifier assembly 146 and the body structure 176 has a cooler overall temperature near the inner surface 168 than the heat map of FIG. 8A. Additionally, the areas around the amplifier mounting location 192 are noticeably cooler, thereby demonstrating improved heat dissipation for the amplifier. FIG. 9A illustrates the thermal map of FIG. 8A on a larger temperature scale. As shown, the amplifier mounting location 190 and the entire lower portion of the amplifier assembly 146 are noticeably hotter in the standard configuration. FIG. 9B illustrates the thermal map of FIG. 8B on a larger temperature scale. Again, the amplifier mounting location 192 is noticeably hotter, but the remaining area of the amplifier assembly 146 remains below 30° C. during operation.

In addition to the spatial power-combining devices previously described, nonlinear antenna structures as described herein may be utilized in other power-combining devices. For example, a solid state power amplifier (SSPA) is configured to deliver an electromagnetic signal to one or more amplifiers for amplification and power combining schemes are configured to subsequently combine outputs from the multiple amplifiers into an amplified output signal. In certain applications, an SSPA may comprise a generally planar structure with an input port, an output port, and waveguide channels that are between the input port and the output port. The waveguide channels may be configured to split an input signal across multiple paths that lead to separate amplifiers. Nonlinear antenna structures may be utilized within the waveguide channels to couple signals to and from the amplifiers.

Figure 10:
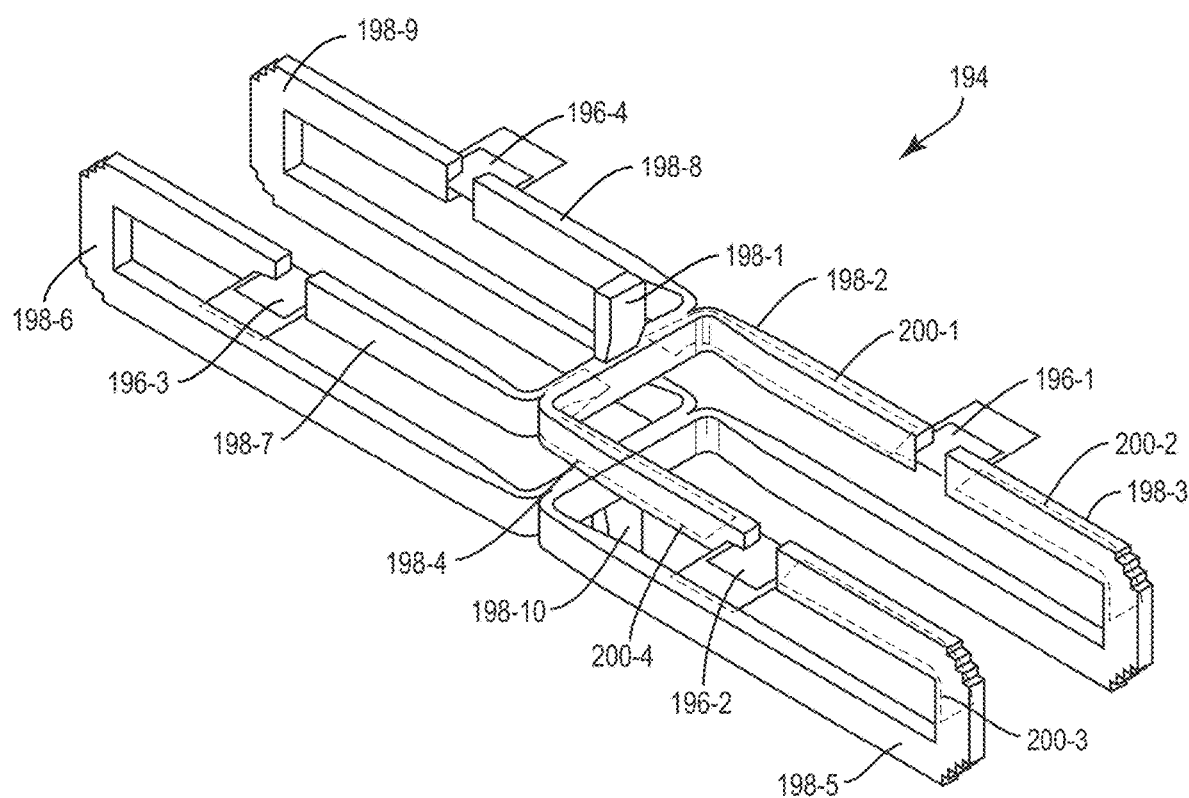
FIG. 10 is a perspective view of a model of a solid state power amplifier (SSPA) that includes nonlinear antenna structures according to embodiments disclosed herein.

FIG. 10 is a perspective view of a model of an SSPA 194 that includes nonlinear antenna structures according to embodiments disclosed herein. The SSPA includes four amplifiers 196-1 to 196-4 that are arranged in a planar configuration and coupled along a plurality of waveguide segments 198-1 to 198-10. The waveguide segment 198-1 is configured to receive a signal from an input port (not shown) and the waveguide segments 198-2, 198-4, 198-7, and 198-8 are configured to respectively split the signal and concurrently deliver portions of the signal to each of the amplifiers 196-1 to 196-4. The waveguide segments 198-3, 198-5, 198-6, and 198-9 are configured to combine amplified signals from the amplifiers 196-1 to 196-4 to the waveguide segment 198-10, and the waveguide segment 198-10 is configured to output the amplified signal to an output port (not shown). The SSPA 194 further includes nonlinear antenna structures 200-1 to 200-4 as illustrated by the dashed lines in FIG. 10 that are within the waveguide segments 198-2 to 198-5. In particular, the waveguide segment 198-2 includes the nonlinear antenna structure 200-1 that bends about 90° between the waveguide segment 198-1 and the amplifier 196-1. In this regard, the nonlinear antenna structure 200-1 is an input antenna structure that is configured to transition a portion of an input signal that is propagating through the waveguide segment 198-2 to the amplifier 196-1 with reduced signal loss. As previously described, the antenna structure 200-1 may comprise an input signal conductor and an input ground conductor on opposing faces of a board, wherein the input signal conductor and the input ground conductor collectively form an input antenna that comprises a first nonlinear shape that is configured to propagate the portion of the input signal along a first nonlinear path. The waveguide segment 198-3 includes the nonlinear antenna structure 200-2 that bends about 90° between the amplifier 196-1 and the waveguide segment 198-10. Accordingly, the nonlinear antenna structure 200-2 is an output antenna structure that is configured to transition an amplified signal from the amplifier 196-1 to the waveguide segment 198-3. As previously described, the output antenna structure may comprise an output signal conductor and an output ground conductor on opposing faces of a board, wherein the output signal conductor and the output ground conductor collectively form an output antenna that comprises a second nonlinear shape that is configured to propagate the amplified signal along a second nonlinear path. As illustrated in FIG. 10, the first nonlinear shape of the antenna structure 200-1 may be different than the second nonlinear shape of the antenna structure 200-2. In particular the antenna structures 200-1 and 200-2 may be configured to bend in different directions relative to the amplifier 196-1. For simplicity in the drawings, the nonlinear antenna structures are only illustrated for the amplifiers 196-1 and 196-2, although it is understood the SSPA 194 may also include nonlinear input and output antenna structures for the amplifiers 196-3 and 196-4.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising a plurality of amplifier assemblies, wherein each amplifier assembly of the plurality of amplifier assemblies comprises:
   an amplifier;
   an input antenna structure comprising an input antenna; and
   an output antenna structure comprising an output antenna, wherein the amplifier is coupled between the input antenna structure and the output antenna structure and at least one of the input antenna or the output antenna comprises a nonlinear shape that is configured to propagate a signal along a nonlinear path to or from the amplifier.

2. The spatial power-combining device of claim 1, wherein the input antenna comprises an input signal conductor and an input ground conductor that collectively form the nonlinear shape.

3. The spatial power-combining device of claim 2, further comprising an input signal connector portion that is configured to couple the input signal conductor with the amplifier.

4. The spatial power-combining device of claim 1, wherein the output antenna comprises an output signal conductor and an output ground conductor that collectively form the nonlinear shape.

5. The spatial power-combining device of claim 4, further comprising an output signal connector portion that is configured to couple the output signal conductor with the amplifier.

6. The spatial power-combining device of claim 1, wherein the input antenna is configured to receive the signal from a first position that is closer to an inner surface of the amplifier assembly than to an arcuate outer surface of the amplifier assembly.

7. The spatial power-combining device of claim 6, wherein the amplifier is configured at a second position and the second position is closer to the arcuate outer surface than the first position is to the arcuate outer surface.

8. The spatial power-combining device of claim 7, wherein the output antenna is configured to receive an amplified signal from the amplifier and propagate the amplified signal to a third position, and the third position is closer to the inner surface than the second position is to the inner surface.

9. The spatial power-combining device of claim 1, wherein each amplifier assembly comprises a body structure that comprises a nonlinear recess that corresponds to the nonlinear shape.

10. The spatial power-combining device of claim 9, wherein at least a portion of the nonlinear recess extends completely through the body structure.

11. The spatial power-combining device of claim 9, wherein the body structure comprises a wedge shape.

12. The spatial power-combining device of claim 1, wherein the nonlinear shape comprises a curved shape.

13. The spatial power-combining device of claim 12, wherein the curved shape comprises one or more inflection points.

14. The spatial power-combining device of claim 1, further comprising:
   an input coaxial waveguide section configured to concurrently provide a signal to the input antenna structure of each amplifier assembly of the plurality of amplifier assemblies; and
   an output coaxial waveguide section configured to concurrently combine a signal from the output antenna structure of each amplifier assembly of the plurality of amplifier assemblies.

15. The spatial power-combining device of claim 1, wherein the plurality of amplifier assemblies is arranged radially around a center axis of the spatial power-combining device.

16. The spatial power-combining device of claim 1, wherein the amplifier comprises a monolithic microwave integrated circuit (MMIC) amplifier.

17. A solid state power amplifier (SSPA) comprising:
   a plurality of solid state amplifiers;
   a plurality of waveguide segments coupled to the plurality of solid state amplifiers; and
   a plurality of input antenna structures that are configured to transition portions of a signal propagating through certain ones of the plurality of waveguide segments to the plurality of solid state amplifiers, wherein at least one of the plurality of input antenna structures comprises a first nonlinear shape that is configured to propagate the signal along a nonlinear path.

18. The SSPA of claim 17, wherein each of the plurality of input antenna structures comprises an input signal conductor and an input ground conductor that collectively form an input antenna comprising the first nonlinear shape.

19. The SSPA of claim 17, further comprising a plurality of output antenna structures that are configured to transition amplified signals from the plurality of solid state amplifiers to different ones of the plurality of waveguide segments, wherein in at least one of the plurality of output antenna structures comprises a second nonlinear shape that is configured to propagate a corresponding amplified signal along a second nonlinear path.

20. The SSPA of claim 17, wherein each of the plurality of output antenna structures comprises an output signal conductor and an output ground conductor that collectively form an output antenna comprising a second nonlinear shape.

21. The SSPA of claim 17, wherein the plurality of solid state amplifiers comprises a plurality of monolithic microwave integrated circuit (MMIC) amplifiers.

\* \* \* \* \*